(12) United States Patent
Kuo

(10) Patent No.: US 8,862,648 B2
(45) Date of Patent: Oct. 14, 2014

(54) FAST FILTER CALIBRATION APPARATUS

(75) Inventor: Feng Wei Kuo, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 684 days.

(21) Appl. No.: 13/114,788

(22) Filed: May 24, 2011

(65) Prior Publication Data

US 2012/0303688 A1 Nov. 29, 2012

(51) Int. Cl.
*G06F 17/10* (2006.01)
*H03J 1/00* (2006.01)

(52) U.S. Cl.
CPC ........... *H03J 1/0008* (2013.01); *H03J 2200/03* (2013.01)
USPC ....................................................... 708/309

(58) Field of Classification Search
CPC ...... G06F 17/10; H04Q 1/4575; G01R 23/02; G01R 23/167; G01S 19/36
USPC .......................................... 708/300–323, 819
See application file for complete search history.

(56) References Cited

U.S. PATENT DOCUMENTS

| | | |
|---|---|---|
| 3,900,890 A | 8/1975 | Eibner |
| 4,352,074 A | 9/1982 | Blinchikoff et al. |
| 4,706,263 A | 11/1987 | von der Embse |
| 5,124,670 A | 6/1992 | Lawton |
| 5,266,907 A | 11/1993 | Dacus |
| 5,369,404 A | 11/1994 | Galton |
| 5,727,038 A | 3/1998 | May et al. |
| 5,781,044 A | 7/1998 | Riley et al. |
| 5,786,778 A | 7/1998 | Adams et al. |
| 5,834,987 A | 11/1998 | Dent |
| 5,903,194 A | 5/1999 | Opsahl et al. |
| 6,008,703 A | 12/1999 | Perrott et al. |
| 6,052,034 A | 4/2000 | Wang et al. |
| 6,127,245 A | 10/2000 | Schoenfeld |
| 6,147,567 A | 11/2000 | Welland et al. |
| 6,150,891 A | 11/2000 | Welland et al. |

(Continued)

FOREIGN PATENT DOCUMENTS

CN 1937420 A 3/2007

OTHER PUBLICATIONS

Vassiliou, I., et al., "A 65nm CMOS Multistandard, Multiband TV Tuner for Mobile and Multimedia Applications," IEEE Journal of Solid-State Circuits, vol. 43, No. 7, Jul. 2008, pp. 1522-1533.

(Continued)

*Primary Examiner* — Tan V. Mai
(74) *Attorney, Agent, or Firm* — Slater & Matsil, L.L.P.

(57) ABSTRACT

A fast filter calibration system includes a multi clock generator, an analog filter including a variable capacitor and a fast calibration apparatus. The fast calibration apparatus further includes a phase comparator, a frequency detector and a fast calibration unit. The fast calibration unit stores a binary code corresponding to a bandwidth frequency of a filter and initiates a fast filter calibration by calibrating the filter from a binary code close to a guaranteed-by-design binary code for the bandwidth frequency to be calibrated.

20 Claims, 8 Drawing Sheets

(56) References Cited

U.S. PATENT DOCUMENTS

| | | | |
|---|---|---|---|
| 6,392,493 | B1 | 5/2002 | Minnis |
| 6,429,693 | B1 | 8/2002 | Staszewski et al. |
| 6,456,164 | B1 | 9/2002 | Fan |
| 6,504,437 | B1 | 1/2003 | Nelson et al. |
| 6,580,376 | B2 | 6/2003 | Perrott |
| 6,606,004 | B2 | 8/2003 | Staszewski et al. |
| 6,844,837 | B1 | 1/2005 | Sutardja et al. |
| 6,927,716 | B2 | 8/2005 | Keaveney et al. |
| 6,995,622 | B2 | 2/2006 | Partridge et al. |
| 7,061,276 | B2 | 6/2006 | Xu |
| 7,092,043 | B2 | 8/2006 | Vorenkamp et al. |
| 7,095,287 | B2 | 8/2006 | Maxim et al. |
| 7,106,388 | B2 | 9/2006 | Vorenkamp et al. |
| 7,142,835 | B2 | 11/2006 | Paulus |
| 7,276,978 | B2 | 10/2007 | Puma et al. |
| 7,558,543 | B2 | 7/2009 | Isaac et al. |
| 7,705,383 | B2 | 4/2010 | Keeth et al. |
| 2001/0050579 | A1 | 12/2001 | Han |
| 2002/0167360 | A1 | 11/2002 | Smith |
| 2004/0176058 | A1 | 9/2004 | Johnson |
| 2005/0077969 | A1 | 4/2005 | Lalt et al. |
| 2005/0129142 | A1 | 6/2005 | Yellin et al. |
| 2005/0276358 | A1 | 12/2005 | Pipilos |
| 2006/0035619 | A1 | 2/2006 | Hallivuori et al. |
| 2006/0077010 | A1* | 4/2006 | Jensen et al. ............ 331/16 |
| 2006/0135195 | A1 | 6/2006 | Leinonen et al. |
| 2006/0192620 | A1 | 8/2006 | Beaulaton et al. |
| 2006/0276149 | A1 | 12/2006 | Womac et al. |
| 2007/0040617 | A1* | 2/2007 | Koukab et al. ............ 331/16 |
| 2007/0049224 | A1 | 3/2007 | Womac |
| 2007/0207760 | A1 | 9/2007 | Kavadias et al. |
| 2011/0279175 | A1* | 11/2011 | Kuo et al. ............ 327/553 |

OTHER PUBLICATIONS

Heping, M., et al., "A Muli-Standard Active-RC Filter with Accurate Tuning System," Journal of Semiconductors, vol. 30, No. 9, Sep. 2009.

Antonine, P. et al., "A Direct-Conversion Receiver for DVB-H," IEEE Journal of Solid-State Circuits, vol. 40, No. 12, Dec. 2005, pp. 2536-2546.

Dawkins, M. et al., "A Single-Chip Tuner for DVB-T", IEEE Journal of Solid-State Circuits, vol. 38, No. 8, Aug. 2003, pp. 1307-1317.

EICTA—European Industry Association, Information Systems Communication Technologies Consumer Electronics, EICTA/TAC/MBRAI-0216, Mobile and Portable DVB-T/H Radio Access Interface Specification, Version 2.0, pp. 1-63.

Womac, M. "Global Mobile TV Standard Makes it Possible to Tune in Digital TV Signals on the Move," Jun. 2005.

Love, J. "Single-Chip Tuner Enables Broadcast TV in Both European and North American Handsets", eeProductCenter (Jun. 6, 2005 6:32 AM ET).

Rogers, J. et al., "A Multiband ΔΣ Fractional-N Frequency Synthesizer for a MIMO WLAN Transceiver RFIC", IEEE Journal of Solid-State Circuits, vol. 40, Issue 3, Mar. 2005, pp. 678-689.

Magoon, R. et al.,"A Single-Chip Quad-Band (850/900/1800/ MHz) Direct Conversion GSM/GPRS RF Transceiver with Integrated VCOs and Fractional-n Synthesizer", IEEE Journal of Solid-State Circuits, vol. 37, Issue 12, Dec. 2002, pp. 1710-1720.

Guenais, M. et al., "A 18 mW Triple 2 GHz CMOS PLL for 3G Mobile Systems with -113 dBc/Hz GSM In-Band Phase Noise and Dual-Port GMSK Modulation", 2003 IEEE Radio Frequency Integrated Circuits (RFIC) Symposium, Jun. 8-10, 2003, pp. 185-188.

* cited by examiner

FAST FILTER CALIBRATION APPARATUS

BACKGROUND

As technologies evolve, new internet phone services for mobile devices emerge. In accordance with a specification for providing broadcast services to mobile devices, digital television broadcasting standards may be divided into three major categories. Advanced Television Standards Committee (ATSC) is a standard used in North America. Integrated Service Digital Broadcasting (ISDB) is a standard mainly used in Japan. Digital Video Broadcasting (DVB) is a standard used in European countries. Digital Video Broadcasting-Handheld (DVB-H), as a subset of DVB, is specifically designed to provide mobile broadcasting services to mobile handsets, such as mobile phones.

Each mobile handset may comprise a receiver to handle a variety of mobile standards and corresponding frequency spectra adopted by the variety of mobile standards. There are two prevailing receiver architectures. One is a super-heterodyne architecture, which converts an input signal of a receiver into an intermediate frequency signal so that better receiver performance can be achieved because receiver components such as filters can be optimized to work at the intermediate frequency. The other prevailing receiver architecture is based upon direct conversion. A direct conversion receiver mixes a radio frequency signal with a signal generated by a local oscillator at the radio frequency. The direct conversion receiver further comprises low frequency filters used to eliminate unwanted noise from the mixed signal and convert the mixed signal directly to a baseband frequency signal without an intermediate frequency.

The performance of receiver filters has direct impact on quality of baseband signals. The receiver filters' performance may vary under different operating conditions. For example, due to variations in process, voltage, and temperature (PVT), the bandwidth of a filter may shift out of the range to which it is specified. In order to compensate for the variations due to PVT, a calibration process may be employed to fine-tune the bandwidth of a receiver filter so that the receiver can provide high quality baseband signals.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a fast calibration apparatus for an analog baseband filter. The invention may also be applied, however, to a variety of filters in different types of receiver circuits.

Figure 1:
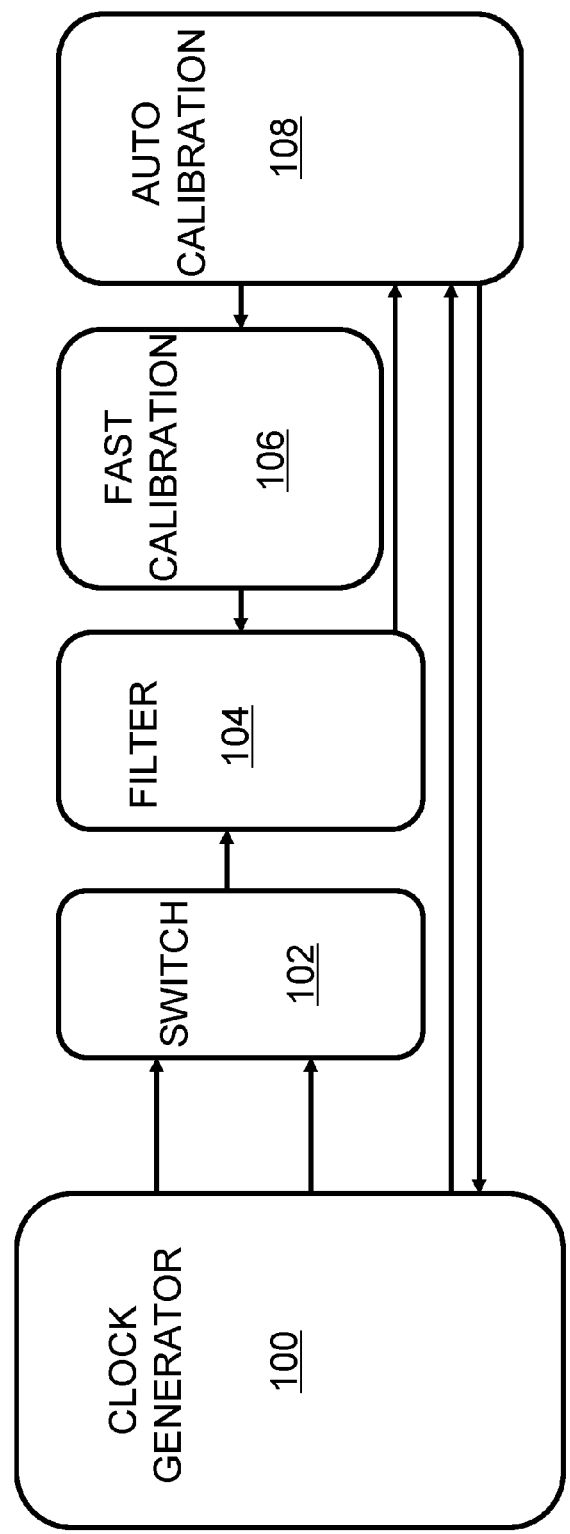
FIG. 1 illustrates a simplified block diagram of a fast filter calibration system in accordance with an embodiment.

Referring initially to FIG. 1, a simplified block diagram of a fast filter calibration system is illustrated in accordance with an embodiment. The fast filter calibration system comprises a multi clock system (also known as a clock generator) 100, a switch unit 102, a filter unit 104, a fast calibration apparatus 106 and an auto calibration apparatus 108. In accordance with an embodiment, the multi clock system 100 generates a calibration signal having the same frequency as the bandwidth of filters to be calibrated. The multi clock system 100 may further comprise a mixer (not shown but illustrated in FIG. 2). The detailed function of the mixer will be described with respect to FIG. 2. The switch unit 102 has two inputs coupled to the output of the multi clock system 100. The switch unit 102 has an output coupled to the input of the filter unit 104. The switch unit 102 is configured such that: when the filters of the filter unit 104 are under a calibration mode, the switch unit 102 forwards the calibration signal generated by the multi clock system 100 to the filter unit 104; when the filters of the filter unit 104 are operating under a normal mode after the calibration mode is complete, the switch unit 102 forwards the output signal of the mixer to the filter unit 104.

The filter unit 104 comprises a plurality of filters. Each filter may comprise a variable capacitor. By adjusting the variable capacitor's value through a bandwidth code (BWC), the filter can adjust its bandwidth accordingly. When the filter unit 104 is operating under a calibration mode, the output signal of the filter unit 104 is coupled to an input of the auto calibration apparatus 108. In auto calibration apparatus 108, the output signal of the filter unit 104 is compared with the output signal of the multi clock system 100, and a phase comparator and a frequency detector of the auto calibration apparatus 108 determine whether there is a phase lag and/or a frequency shift between these two signals. Furthermore, if a state machine of the auto calibration apparatus 108 finds that the phase lag and/or the frequency shift cannot satisfy a predetermined threshold, the auto calibration apparatus 108 adjusts the bandwidth of the filter unit 104 by sending an updated BWC corresponding to a new bandwidth frequency of the filter unit. The fast calibration apparatus 106 receives the comparison results from the auto calibration apparatus 108 and speeds up the bandwidth calibration process by employing a fast locked state machine. The details of the operation of the fast calibration apparatus 106 will be described below with respect to FIG. 5.

Figure 2:
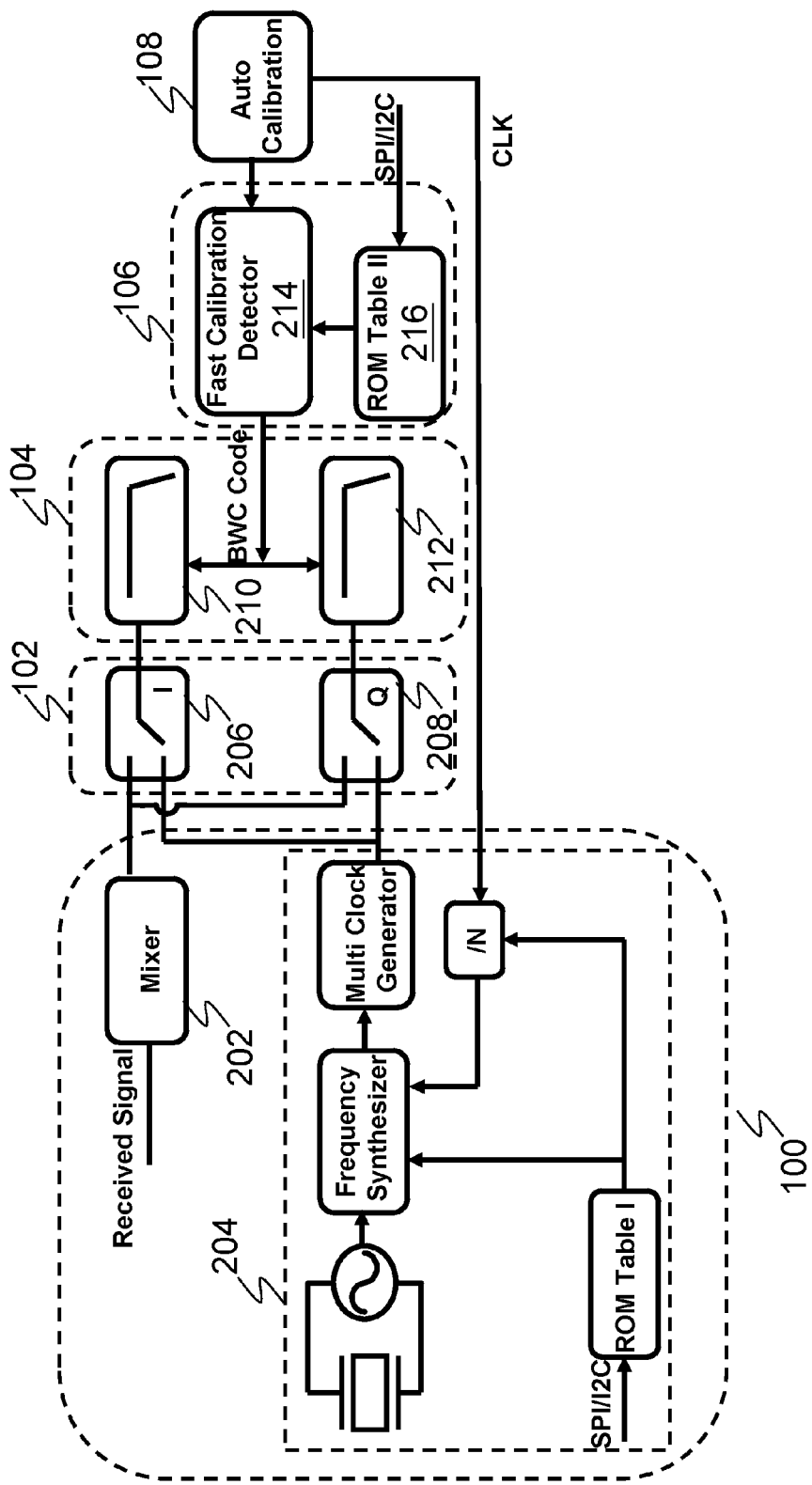
FIG. 2 illustrates in detail a block diagram of the fast filter calibration system shown in FIG. 1.

FIG. 2 illustrates in detail a block diagram of a fast filter calibration system. As illustrated in FIG. 2, the multi clock system 100 further comprises a mixer 202 and a multi clock generator 204. The multi clock generator 204 comprises a crystal, an oscillator, a read-only memory (ROM) table, a frequency divider and a frequency synthesizer. As known in the art, the multi clock generator 204 is capable of generating a calibration signal based upon a clock signal generated by the crystal and the oscillator, a first control signal stored in the ROM table and a second control signal supplied by an auto calibration clock signal divided by a factor of N by means of the frequency divider. In order to calibrate the in-phase signal path and the quadrature signal path, the multi clock generator 204 may generate both in-phase calibration signals and quadrature calibration signals at the output of the multi clock generator 204. The operation of the multi clock generator is known in the art, and thus is not further discussed herein.

The mixer 202 receives a baseband frequency signal and generates an in-phase component and a quadrature component of the baseband frequency signal. The in-phase component may have the same phase as the received baseband frequency signal or a phase shift of 180 degrees between the in-phase component and the received baseband frequency signal. In contrast, the quadrature component may have a phase shift of either 90 degrees or 270 degrees. As described above with respect to FIG. 1, under a normal operation mode, the mixer 202 provides both the in-phase component and the quadrature component of the received signal to the filter unit 104. On the other hand, when the filter unit 104 is operating under a calibration mode, the multi clock generator 204 provides a calibration signal based upon a first control signal stored in the ROM table and a second control signal supplied by the auto calibration apparatus 108.

The switch unit 102 comprises a first simple changeover switch 206 dedicated to receive the in-phase component of the baseband frequency signal from the output of the mixer 202 during a normal operation. Likewise, the switch unit 102 further comprises a second simple changeover switch 208 dedicated to forward the quadrature component of the based frequency signal from the output of the mixer 202. On the other hand, when the filter unit 104 is operating under a calibration mode, both simple changeover switches 206 and 208 are configured to receive the calibration signal from the multi clock generator and forward the calibration signal to the filter unit 104.

The filter unit 104 may comprise two analog baseband filters. As illustrated in FIG. 2, an in-phase signal filter 210 receives in-phase signal components from the first simple changeover switch 206. Likewise, a quadrature signal filter 212 is use to attenuate unwanted frequencies of quadrature signal components received from the second simple changeover switch 208. Both in-phase signal filter 210 and quadrature signal filter 212 may comprise a variable capacitor whose value can be adjusted by changing a BWC sent from the auto calibration apparatus 108 to the filter unit 104. Furthermore, the variable capacitor is designed to select different bandwidth values for the analog baseband filter (e.g., in-phase signal filter 210). In accordance with an embodiment, the analog baseband filter may have a bandwidth value in a range from 1 MHz to 10 MHz by selecting different BWC values.

In the design stage of an analog baseband filter (e.g., in-phase signal filter 210), a particular variable capacitor value and its corresponding binary code are designed to set the bandwidth value of the analog baseband filter. However, due to variations in process, voltage, and temperature (PVT), the bandwidth of the analog baseband filter may shift out of the range to which it is specified. In order to accurately calibrate the bandwidth of the in-phase signal filter 210 and the quadrature signal filter 212, the auto calibration apparatus 108 and the fast calibration apparatus 106 are employed to generate an appropriate binary code for a given characterization frequency. More particularly, based upon a given signal generated by the multi clock system 100 and the output of the analog baseband filter (e.g., filter 210), the auto calibration apparatus 108 generates a BWC, which is applied to adjusting the variable capacitor of the analog baseband filter so that the bandwidth of the analog baseband filter changes accordingly. The auto calibration apparatus 108 keeps generating BWC (either incrementing or decrementing by 1) until the output of the baseband filter has a frequency matching that of the signal generated by the multi clock system 100. As a result, the last BWC is saved as a channel setting for the analog baseband filter. The fast calibration apparatus 106 is used to speed up the process of identifying the last BWC. The detailed operation of the fast calibration apparatus 106 will be described below with respect to FIG. 5.

Figure 3:
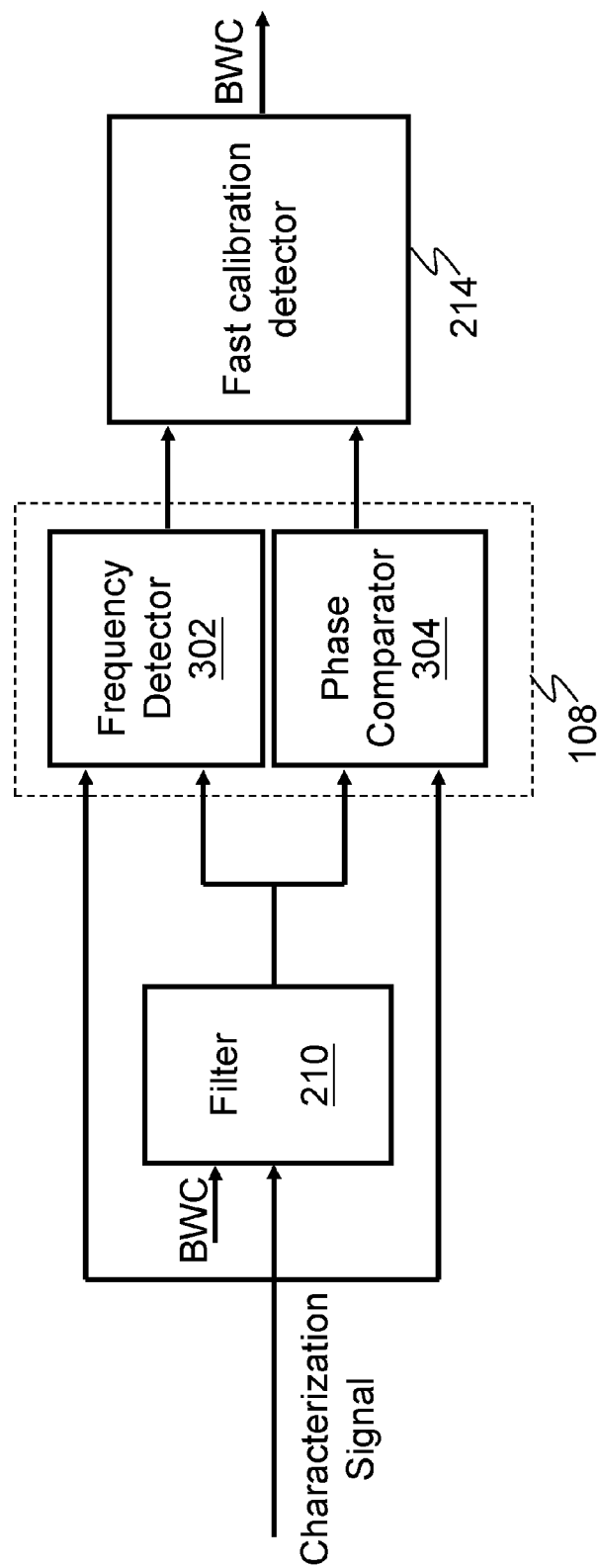
FIG. 3 illustrates a block diagram of an exemplary analog baseband filter fast calibration system in accordance with an embodiment.

FIG. 3 illustrates a block diagram of an exemplary analog baseband filter fast calibration system in accordance with an embodiment. In order to calibrate the bandwidth of an analog baseband filter (e.g., in-phase signal filter 210 shown in FIG. 3), a characterization signal is generated by the multi clock system 100 (not shown but illustrate in FIG. 2) and fed into the in-phase signal filter 210 as well as a frequency detector 302 and a phase comparator 304. The frequency detector 302 and the phase comparator 304 form the auto calibration apparatus 108. Both the frequency detector 304 and the phase comparator 304 receive the input signal and the output signal of the in-phase signal filter 210 and compare both signals in frequency and phase respectively. The detailed operation of the frequency detector 302 and the phase comparator 304 will be illustratively explained with respect to FIG. 4. The fast calibration detector 214, as the main element of the fast calibration apparatus 106, receives the comparison results from the frequency detector 302 and the phase comparator 304 and generates an updated BWC value. In accordance with an embodiment, BWC is an 8-bit signal used to adjust the variable capacitor of the analog baseband filter (e.g., in-phase signal filter 210). It should be noted that while an 8-bit BWC is employed to illustrate the inventive aspects of various embodiments, one skilled in the art will recognize that an 8-bit BWC is simply one manner of BWC signals and that other BWC signals could be employed (such as employing 4-bit 16-bit BWC). It should further be noted that the filter 210 can be any other appropriate types, such as band-pass filters and high-pass filters.

Figure 4:
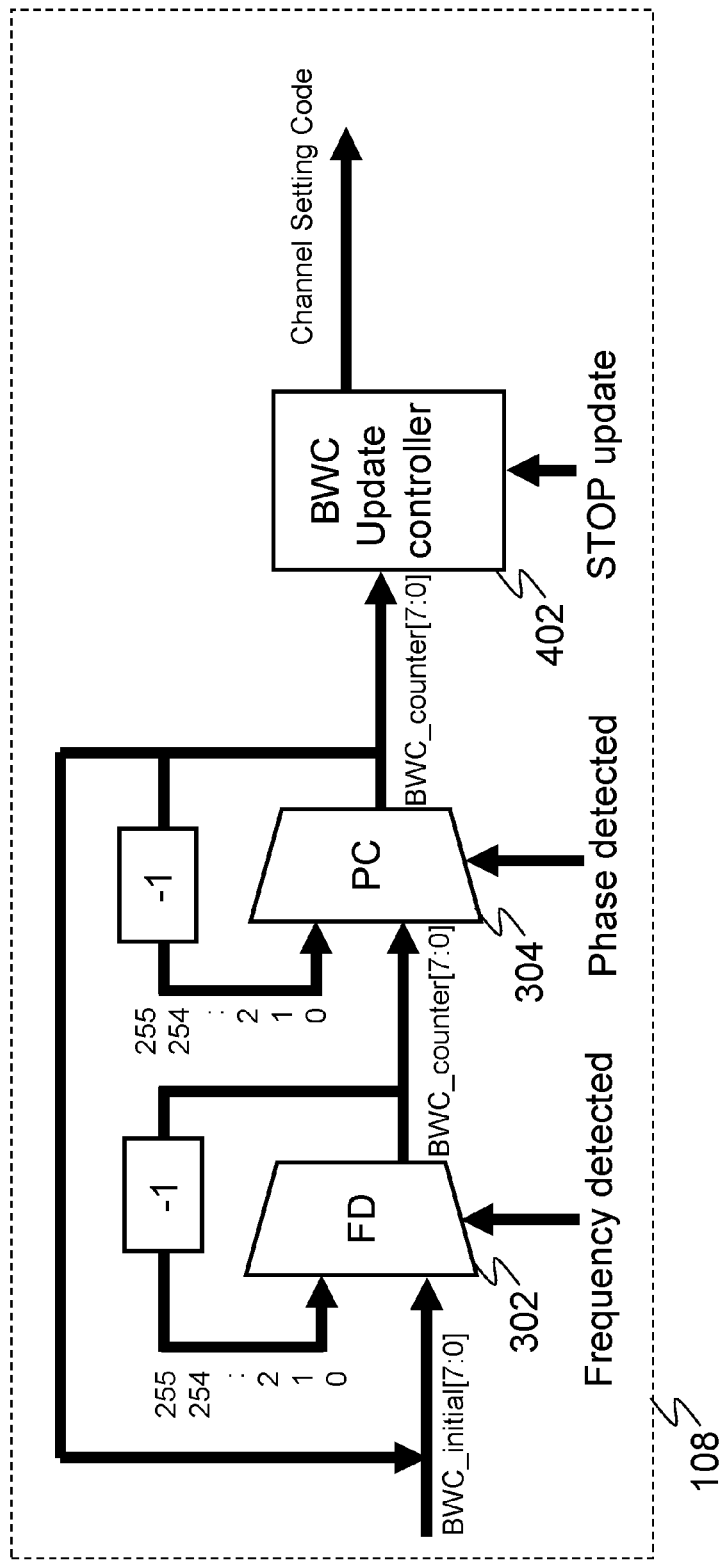
FIG. 4 illustrates the operation of an auto calibration apparatus in accordance with an embodiment.

FIG. 4 illustrates the operation of an auto calibration apparatus in accordance with an embodiment. The auto calibration apparatus 108 may comprises a frequency detector 302, a phase comparator 304 and a BWC update controller 402. During an 8-bit accuracy calibration process, for example, the calibration process may start from the highest value of an 8-bit BWC (255 in decimal). In accordance with the operation of the auto calibration apparatus, a binary code equal to 255 in decimal may correspond to the lowest bandwidth to be calibrated. For example, an analog baseband filter is capable of having a bandwidth value from 1 MHz to 10 MHz by selecting different variable capacitance values. The highest value of the 8-bit binary code (255 in decimal) may correspond to one variable capacitor value by which the analog baseband filter is set to 1 MHz bandwidth. On the contrary, the lowest value of the 8-bit binary code (0 in decimal) may correspond to another variable capacitor value by which the analog baseband filter is set to 10 MHz bandwidth. When a 4 MHz bandwidth frequency is calibrated, a number 65 (in decimal) may correspond to the variable capacitor by which the filter can be set to a 4 MHz bandwidth. In accordance with another embodiment, when a 5 MHz bandwidth frequency is calibrated, a number 51 (in decimal) may correspond to the variable capacitor by which the filter can be set to a 5 MHz bandwidth.

As shown in FIG. 4, both the frequency detector 302 and the phase comparator 304 compare the filter output set by the initial value 255 with the input signal of the filter. When the comparison results cannot satisfy the predetermined thresholds for frequency shift and phase lag, the BWC update controller 402 reduces BWC by 1 and adjusts the filter's bandwidth accordingly. The frequency detector 302 and the phase comparator 304 keep comparing the output of the filter and the input signal of the filter until the comparison results show the phase lag and frequency shift between input signal and the output signal of the filter are within the predetermined thresholds. As a result, the BWC update controller 402 stops updating the BWC value and reports a channel setting code.

Figure 5:
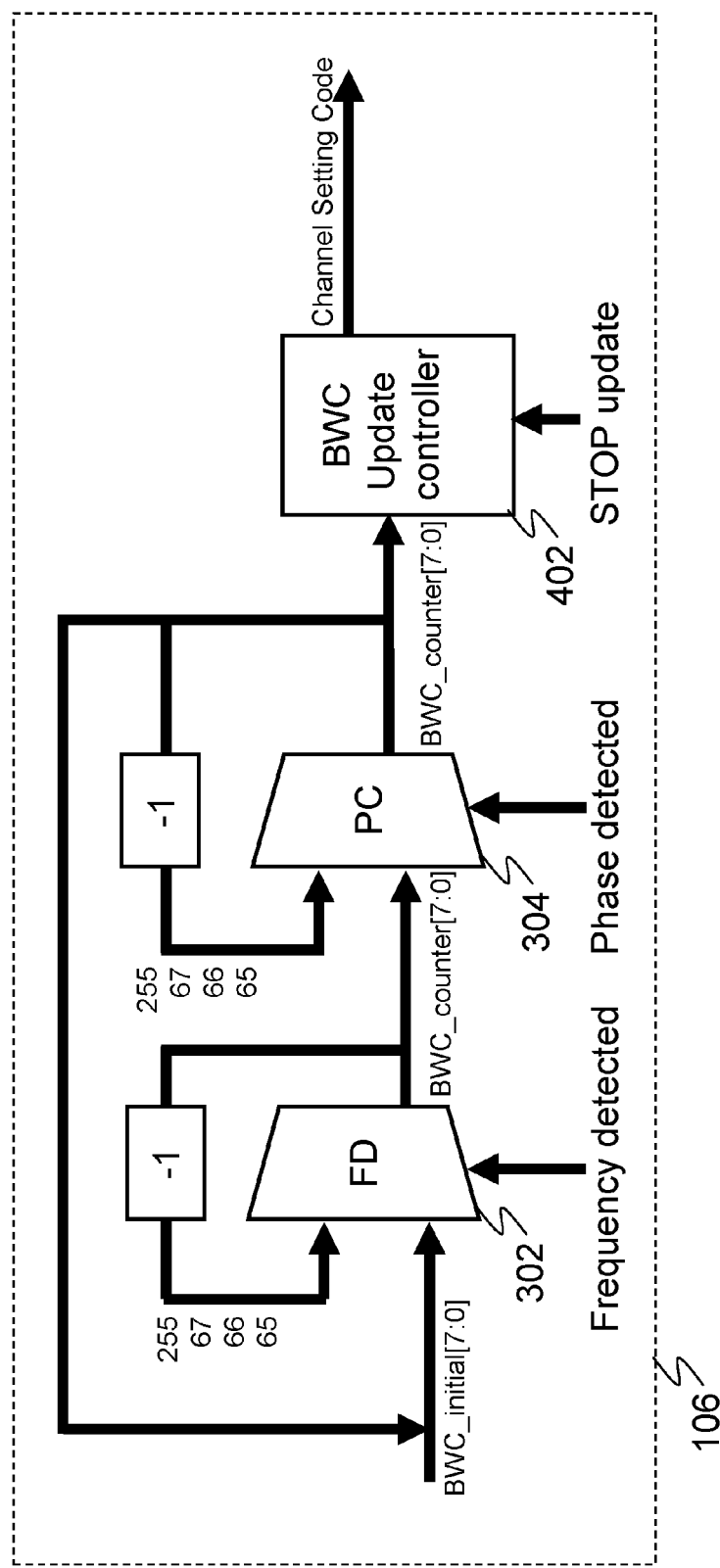
FIG. 5 illustrates the operation of a fast calibration apparatus in accordance with an embodiment.

FIG. 5 illustrates the operation of a fast calibration apparatus in accordance with an embodiment. The fast calibration apparatus 106 may comprises a frequency detector 302, a phase comparator 304 and a BWC update controller 402. The example described above with respect to FIG. 4 is reused to illustrate an advantageous feature of the fast calibration apparatus 106. As described above, when a 4 MHz bandwidth frequency is calibrated, a number 65 (in decimal) may be used to set a variable capacitor's value so that the filter can achieve a 4 MHz bandwidth. As shown in FIG. 5, both the frequency detector 302 and the phase comparator 304 compare the filter output set by the initial value 255 with the input signal of the filter. When the comparison results cannot satisfy the predetermined thresholds for frequency shift and phase lag, the BWC update controller 402 jumps from 255 to 67 directly and adjust the filter's bandwidth accordingly. As a consequence, the frequency detector 302 and the phase comparator 304 can finish the calibration of 4 MHz bandwidth within the next two cycles. As a result, the fast calibration apparatus 106 can save the total calibration time and resources. For example, in accordance with an embodiment, the total calibration time for a bandwidth frequency (e.g., 4 MHz) is 125 us if the BWC update follows the following sequence:

255→254→253→ . . . 67→66→65

In contrast, the total calibration time for the same bandwidth frequency with a fast calibration apparatus is approximately 5 us based upon the following sequence:

255→67→66→65

An advantageous feature of having a fast calibration apparatus is that the total calibration time and resources can be reduced.

Figure 6:
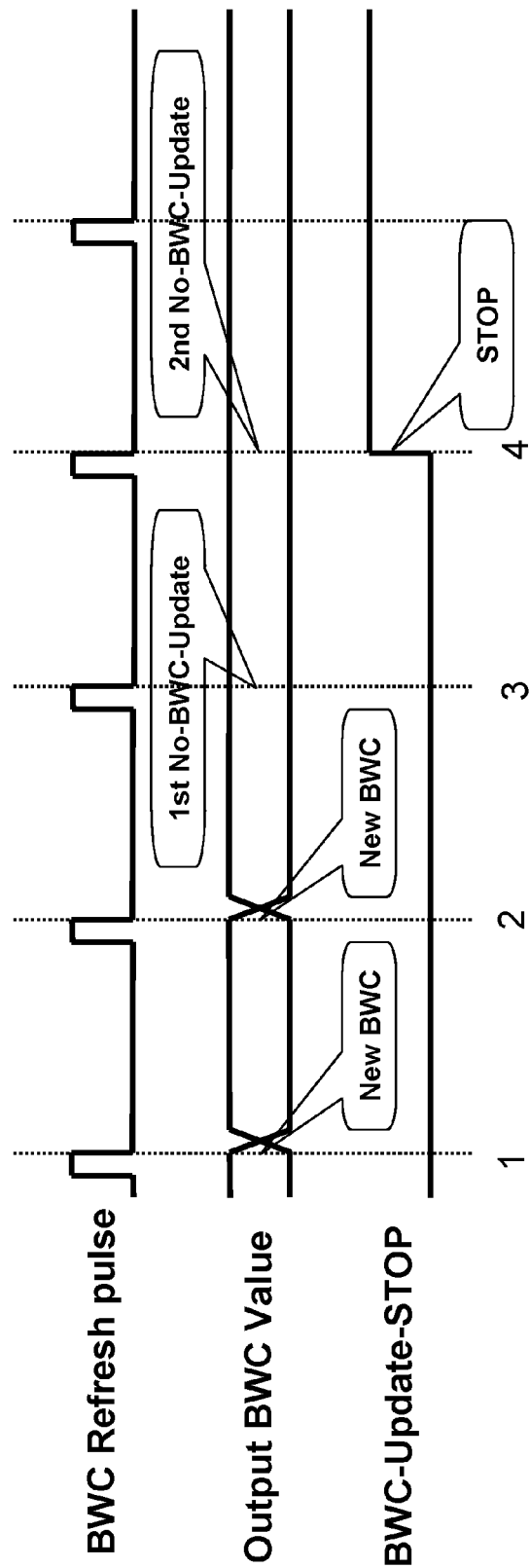
FIG. 6 illustrates the process of a bandwidth code (BWC) update in accordance with an embodiment.

FIG. 6 illustrates the process of a BWC update in accordance with an embodiment. As shown in FIG. 6, at each falling edge of a BWC refresh pulse, the BWC update controller 402 (not shown but illustrated in FIG. 5) detects the change of BWC. For example, at a first time instance, changes occur. As a result, an indicator BWC-Update-STOP (shown in FIG. 6) remains "0" in accordance with the operation of the BWC update controller 402. Likewise, at a second time instance as shown in FIG. 6, the BWC values at the second time instance change again. As a consequence, the indicator BWC-Update-STOP remains "0". At a third time instance, the BWC values remain the same as the previous time instance. The BWC update controller records this as the first No-BWC-Update event (shown in FIG. 6) and does not change the status of the indicator BWC-Update-S TOP until a repetitive No-BWC-Update event comes. At a fourth time instance, the BWC update controller detects the BWC values remain the same again. According to the operation of the BWC update controller 402, when the BWC-Update-STOP changes its status from "0" to "1", which indicates that a reliable BWC code has been identified, the last BWC can be saved as a channel setting for a particular bandwidth frequency.

Figure 7:
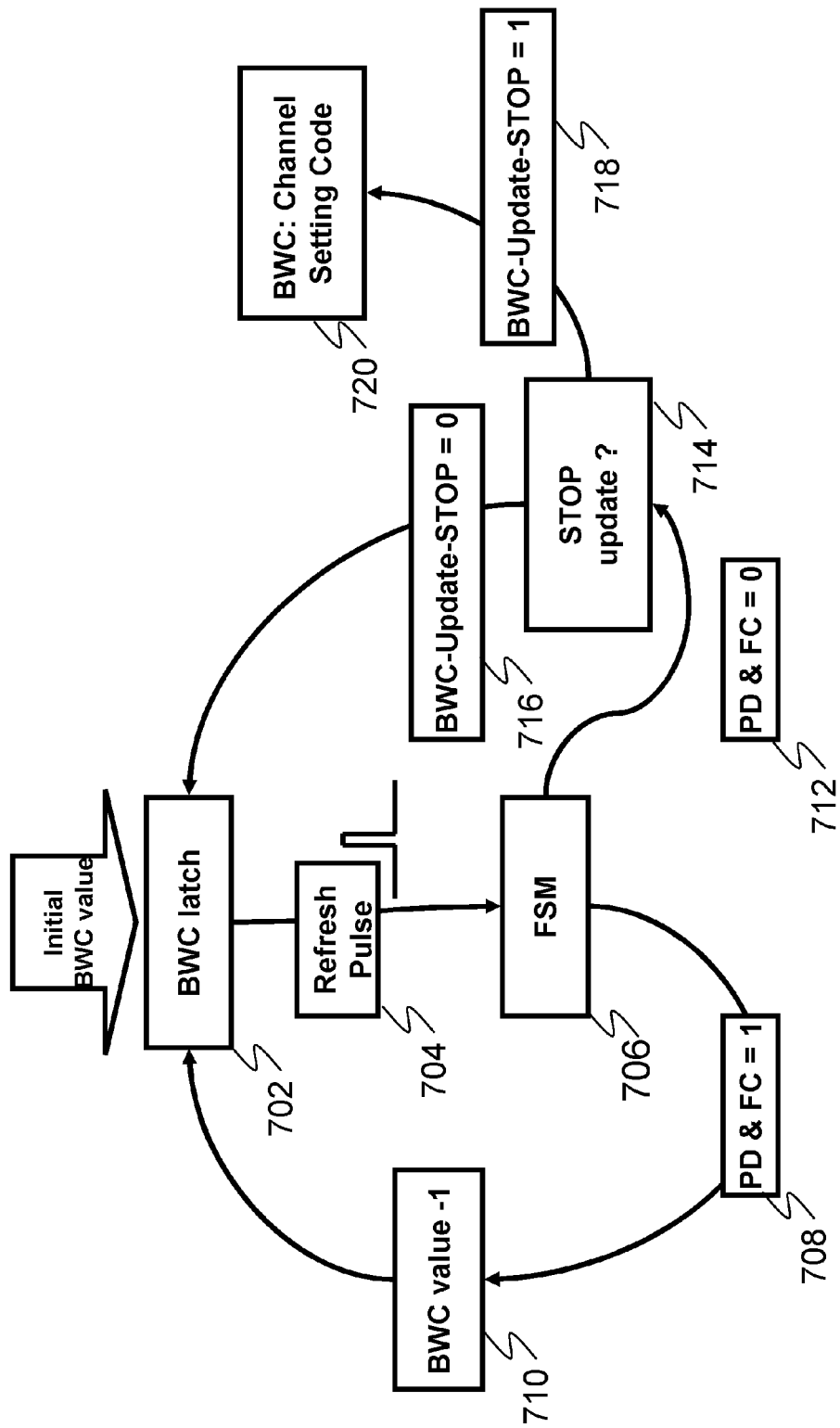
FIG. 7 illustrates a flowchart of identifying a channel setting by means of the BWC update controller shown in FIG. 6.

FIG. 7 illustrates a flowchart of identifying a channel setting by means of the BWC update controller shown in FIG. 6. In a calibration process, an initial BWC value may be selected to start the calibration process. In an 8-bit accuracy calibration, the initial value may be 255 in decimal as described above with respect to FIG. 5. A BWC latch receives the initial value and adjusts the variable capacitor of an analog baseband filter accordingly at step 702. Subsequently, at step 704, when a new refresh pulse comes, a phase comparator (not shown) and a frequency detector (not shown) compare the input signal and the output signal of the analog baseband filter.

At step 706, a state machine (not shown) receives the comparison results from the phase comparator and the frequency detector. When the phase lag and the frequency shift are not within the predetermined thresholds, the state machine sets two indicators PD and FC as "1" and the calibration process takes the route formed by steps 708 and 710 wherein the BWC value is changed. In a calibration process with the fast calibration apparatus 106 (not shown), the BWC update controller 402 may bypass step 710 and change the BWC from 255 to 67 or some other predetermined values directly. In the subsequent iteration processes, when the calibration process takes the route formed by steps 708 and 710 again, at step 710, the BWC value is reduced by 1.

On the other hand, when both the phase lag and the frequency shift can satisfy the predetermined thresholds, the state machine sets two indicators PD and FC as "0" at step 712. Subsequently, at step 714, the calibration process determines whether an indicator BWC-Update-STOP is "0" or "1". As described above with respect to FIG. 6, when the indicator BWC-Update-STOP is still "0", the calibration process returns to the step 702 and starts the calibration again. In contrast, when the indicator BWC-Update-STOP has been changed to "1", the last BWC value is saved as a channel setting at step 720.

Figure 8:
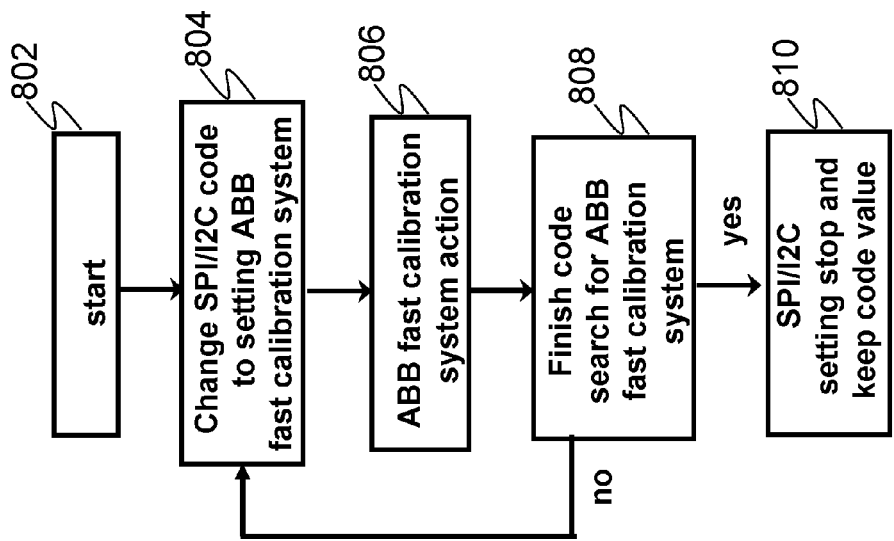
FIG. 8 illustrates a flowchart of employing the fast calibration apparatus in an analog baseband filter calibration process.

FIG. 8 illustrates a flowchart of employing the fast calibration apparatus in an analog baseband filter calibration. At step 802, when a calibration process starts, the initial binary code for setting the bandwidth of the analog baseband filter may be far away from the correct value. For example, in an 8-bit accuracy calibration process, the initial value may be 255 in comparison with a correct value 65. At step 804, the fast calibration apparatus acknowledges a guaranteed-by-design value such as 65 through the design information of the analog baseband filter. Due to various variations such as PVT, the fast calibration apparatus selects a number higher than the guaranteed-by-design value so that the various variations can be covered. In this example, a number 67 may be given at step 804 to start the calibration process. At step 806, the fast calibration system comprising a phase comparator and a frequency detector compares the input signal and the output signal of the analog baseband filter. At step 808, a state machine decides whether the phase lag and the frequency shift are within the predetermined thresholds. If the phase lag and the frequency shift cannot satisfy the predetermined thresholds, the calibration process returns to step 804 and reduces the number by 1 (such as from 67 to 66). The calibration process repeats the process until both the phase lag and the frequency shift are within the thresholds. At step 810, the calibration process stops and the last number (e.g., 65 in this example) will be recorded as a channel setting.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A fast calibration apparatus comprising:
    an auto calibration unit comprising:
        a phase comparator configured to receive an output from a filter;
        a frequency detector configured to receive the output from the filter; and
    a fast calibration unit configured to generate a starting binary code for calibrating a bandwidth frequency of the filter based upon:
        a binary code corresponding to the bandwidth frequency of the filter, wherein the binary code is a guaranteed-by-design value; and
        a margin number corresponding to processing and operational variations of the bandwidth frequency of the filter, wherein the fast calibration unit comprises an input coupled to the auto calibration unit and an output coupled to the filter.

2. The fast calibration apparatus of claim 1, further comprising a read-only memory (ROM) table wherein the starting binary code is saved.

3. The fast calibration apparatus of claim 1, wherein the phase comparator compares an input signal of the filter with an output signal of the filter and reports a phase lag between the input signal of the filter and the output signal of the filter.

4. The fast calibration apparatus of claim 1, wherein the frequency detector compares an input signal of the filter with an output signal of the filter and reports a frequency shift between the input signal of the filter and the output signal of the filter.

5. The fast calibration apparatus of claim 1, wherein the fast calibration unit adjusts the bandwidth frequency of the filter by sending the binary code to the filter based upon comparison results from the phase comparator and the frequency detector.

6. The fast calibration apparatus of claim 1, wherein the fast calibration unit continues sending an updated binary code to adjust the bandwidth frequency of the filter until:
    a phase lag between an input signal of the filter and an output signal of the filter is within a predetermined phase lag threshold; and
    a frequency shift between the input signal of the filter and the output signal of the filter is within a predetermined frequency shift threshold.

7. The fast calibration apparatus of claim 6, wherein the fast calibration unit records a channel setting based upon the updated binary code when the bandwidth frequency of the filter based upon the updated binary code satisfies:
    the phase lag between the input signal of the filter and the output signal of the filter is within the predetermined phase lag threshold; and
    the frequency shift between the input signal of the filter and the output signal of the filter is within a predetermined frequency shift threshold.

8. A fast calibration system comprising:
    a multi clock generator configured to generate a characterization signal based upon a channel setting;
    an analog filter comprising a variable capacitor and configured to receive the characterization signal; and
    a fast calibration apparatus comprising:
        an auto calibration apparatus comprising:
            a phase comparator configured to receive an output from the analog filter;
            a frequency detector configured to receive the output from the analog filter; and
        a fast calibration unit configured to generate a starting binary code for calibrating a bandwidth frequency of a filter based upon:
            a binary code corresponding to the bandwidth frequency of the analog filter, wherein the binary code is a guaranteed-by-design value; and
            a margin number corresponding to processing and operational variations of the bandwidth frequency of the analog filter, wherein the fast calibration unit comprises an input coupled to the auto calibration apparatus and an output coupled to the analog filter.

9. The fast calibration system of claim 8, further comprising a switch unit configured such that:
    a signal generated by a mixer is selected and forwarded to an input of the analog filter when the analog filter is operating at a normal mode; and
    a signal generated by the multi clock generator is selected and forwarded to the input of the analog filter when the analog filter is operating at a calibration mode.

10. The fast calibration system of claim 8, wherein the analog filter comprises:
    a first analog filter dedicated to in-phase components of a high frequency signal; and
    a second analog filter dedicated to quadrature components of the high frequency signal.

11. The fast calibration system of claim 8, wherein the analog filter comprises a first analog filter and a second analog filter, and wherein the multi clock generator generates an in-phase characterization signal for calibrating the first analog filter dedicated to in-phase components of a high frequency signal and a quadrature characterization signal for calibrating the second analog filter dedicated to quadrature components of the high frequency signal.

12. The fast calibration system of claim 8, wherein the multi clock generator further comprises a read-only memory (ROM) through which the multi clock generator receives a control signal for generating the characterization signal based upon the channel setting.

13. The fast calibration system of claim 8, wherein the fast calibration apparatus sets the binary code based upon design information of the analog filter and processing and operational variations of the bandwidth frequency of the analog filter.

14. The fast calibration system of claim 8, further comprising the auto calibration apparatus comprising:
    the phase comparator generating a phase lag signal at an output of the phase comparator;
    the frequency detector generating a frequency shift signal at an output of the frequency detector; and a state machine comprising two inputs coupled to the output of the phase comparator and the output of the frequency detector.

15. A system comprising:
a clock generator coupled to a switch unit, wherein the switch unit is configured to receive a plurality of signals from the clock generator;
a filter coupled to the switch unit, wherein the filter comprises:
a plurality of variable capacitors, and wherein the variable capacitors are adjusted based upon a binary code generated by an auto calibration unit and a fast calibration apparatus, wherein:
the binary code is generated for calibrating a bandwidth frequency of the filter;
the auto calibration unit is coupled to the clock generator; and
the fast calibration apparatus comprises an input coupled to the auto calibration unit and an output coupled to the filter.

16. The system of claim 15, wherein the auto calibration unit comprises:
a phase comparator configured to receive an output signal from the filter; and
a frequency detector configured to receive the output signal from the filter.

17. The system of claim 16, wherein the auto calibration unit is configured to:
compare the output signal from the filter with an output signal from the clock generator and find a phase lag between the output signal from the filter and the output signal from the clock generator through the phase comparator.

18. The system of claim 16, wherein the auto calibration unit is configured to:
compare the output signal from the filter with an output signal from the clock generator and find a frequency shift between the output signal from the filter and the output signal from the clock generator through the frequency detector.

19. The system of claim 15, wherein the clock generator comprises:
a mixer configured to receive a baseband frequency signal and generate an in-phase component and a quadrature component of the baseband frequency signal; and
a multi clock generator configured to generate a calibration signal.

20. The system of claim 19, wherein the switch unit comprises a plurality of switches, and wherein the plurality of switches is configured such that:
the switch unit forwards the calibration signal to the filter when the filter is under a calibration mode; and
the switch unit forwards an output signal of the mixer to the filter when the filter is under a normal mode.

* * * * *